(12) United States Patent
Matsui

(10) Patent No.: US 8,337,098 B2
(45) Date of Patent: Dec. 25, 2012

(54) OPTICAL CONNECTOR

(75) Inventor: Takashi Matsui, Miyagi-Ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 77 days.

(21) Appl. No.: 12/986,796

(22) Filed: Jan. 7, 2011

(65) Prior Publication Data

US 2011/0103751 A1 May 5, 2011

Related U.S. Application Data

(63) Continuation of application No. PCT/JP2009/061442, filed on Jun. 24, 2009.

(30) Foreign Application Priority Data

Jul. 18, 2008 (JP) ................................ 2008-187827

(51) Int. Cl.
*G02B 6/36* (2006.01)

(52) U.S. Cl. ................. 385/93; 385/33; 385/34; 385/88; 385/89; 385/92

(58) Field of Classification Search .................... 385/89, 385/92, 93

See application file for complete search history.

(56) References Cited

FOREIGN PATENT DOCUMENTS

| JP | 2002-23025 | 1/2002 |
|---|---|---|
| JP | 2002-196191 | 7/2002 |
| JP | 2003-315636 | 11/2003 |
| JP | 2006-114737 | 4/2006 |
| JP | 2006-126535 | 5/2006 |
| JP | 2008-309923 | 12/2008 |
| JP | 2008309923 A | * 12/2008 |

OTHER PUBLICATIONS

Translation of JP 2008309923 A (Dec. 25, 2008).*
International Search Report issued in corresponding PCT Application No. PCT/JP2009/061442; mailed Jul. 28, 2009.

* cited by examiner

*Primary Examiner* — Ryan Lepisto
(74) *Attorney, Agent, or Firm* — Brinks Hofer Gilson & Lione

(57) ABSTRACT

When a light guide of a sleeve is inserted into a through-hole, a positioning rib is mounted in the holding recess and the sleeve is positioned in the housing. When a transmitting optical module is mounted in a housing space, a positioning protrusion of the sleeve enters a positioning recess of the transmitting optical module and contacts a stepped surface of the transmitting optical module. Thus, the transmitting optical module and a transmitting sleeve are positioned so as to face each other with high precision, and thereby the light transmission efficiency can be increased.

3 Claims, 3 Drawing Sheets

OPTICAL CONNECTOR

CLAIM OF PRIORITY

This application is a Continuation of International Application No. PCT/JP2009/061442 filed on Jun. 24, 2009, which claims benefit of Japanese Patent Application No. 2008-187827 filed on Jul. 18, 2008. The entire contents of each application noted above are hereby incorporated by reference.

BACKGROUND OF THE INVENTION

1. Field of the Invention

The present invention relates to an optical connector including an optical module. In particular, the present invention relates to an optical connector having a high light transmission efficiency between a sleeve and an optical element such as a photodiode or an LED.

2. Description of the Related Art

Japanese Unexamined Patent Application Publication No. 2000-304980 (FIGS. 4 and 5) describes an optical connector including a receiving sleeve and a transmitting sleeve that are disposed in a housing.

In the optical connector described in Japanese Unexamined Patent Application Publication No. 2000-304980, a light receiving module and a light transmitting module are respectively mounted in the first cylindrical socket and the second cylindrical socket so that small diameter surfaces of the sleeves face the light receiving module and the light transmitting module.

Japanese Unexamined Patent Application Publication No. 2002-23025 (see FIGS. 7 and 8, and paragraph 0073) describes an optical connector in which a cylindrical socket is formed in a housing. When a guide portion of a sleeve is inserted into the cylindrical socket, an end of the guide portion contacts a stepped portion formed on the cylindrical socket. Thus, the gap between a receiving device or a transmitting device and a ferrule assembly is minimized and a gap loss in the optical axis direction is minimized.

However, with the optical connectors described in Japanese Unexamined Patent Application Publication Nos. 2000-304980 and 2002-23025, one of the ends of the sleeve that faces the light receiving module or the light transmitting module (hereinafter referred to as the "facing end") is a free end.

Therefore, these optical connectors have a problem in that the facing end is easily displaced in a direction perpendicular to the optical axis and therefore it is difficult to reduce the gap loss between the light receiving module or the light transmitting module and the facing end of the sleeve.

Moreover, in existing optical connectors, the end face of a sleeve that faces the light receiving module or the light transmitting module is a flat surface. Therefore, in particular in the case of the light emitting module, when light emitted by the light emitting module enters the sleeve through the flat end face, a part of the light may be reflected, which causes a problem in that the light transmission efficiency between the light emitting module and the sleeve is low, i.e., the optical coupling loss is large.

SUMMARY OF THE INVENTION

The present invention, which addresses such problems, provides an optical connector that is capable of increasing the light transmission efficiency between an optical module and a sleeve of the optical connector.

According to an aspect of the present invention, an optical connector includes an optical module including an optical element that receives or emits light, a first convex lens that covers the optical element that receives or emits light, and a positioning recess that surrounds the first convex lens; and a sleeve that optically interconnects the optical module and an optical fiber, the sleeve being an integrally formed member including a light guide, a second convex lens formed on an end face of the sleeve, the end face facing the optical module, a substantially annular guide portion, and a positioning protrusion formed on an end face of the substantially annular guide portion, the end face facing the optical module; and a housing that houses the optical module and the sleeve, wherein the positioning protrusion of the sleeve contacts the positioning recess of the optical module so that the sleeve is positioned relative to the optical module, and wherein a diameter of the second convex lens of the sleeve, the second convex lens facing the first convex lens of the optical element that emits light, is larger than a diameter of the first convex lens of the optical element that emits light.

With the present invention, the optical module and the sleeve can be positioned with high precision, and the distance between the first convex lens of the optical module and the second convex lens of the sleeve can be set with high precision. Therefore, the light transmission efficiency between the optical module and the sleeve can be increased.

It is preferable that, in the optical connector, a positioning rib be integrally formed with the substantially annular guide portion of the sleeve, and the positioning rib contact the housing so that the sleeve is mounted in the housing at a predetermined position.

In this case, the sleeve can be positioned and fixed in the housing with high precision.

It is preferable that, in the optical connector, a diameter of the first convex lens of the optical element that receives light be larger than the diameter of the first convex lens of the optical element that emits light.

In this case, a larger amount of light can be collected and made to enter the light receiving element enter, and the light transmission efficiency can be increased.

With the optical connector according to the present invention, the relative positions of the optical module and the sleeve between position can be set with high precision, whereby a loss is reduce and the light transmission efficiency is increased.

DESCRIPTION OF THE PREFERRED EMBODIMENTS

Figure 1:
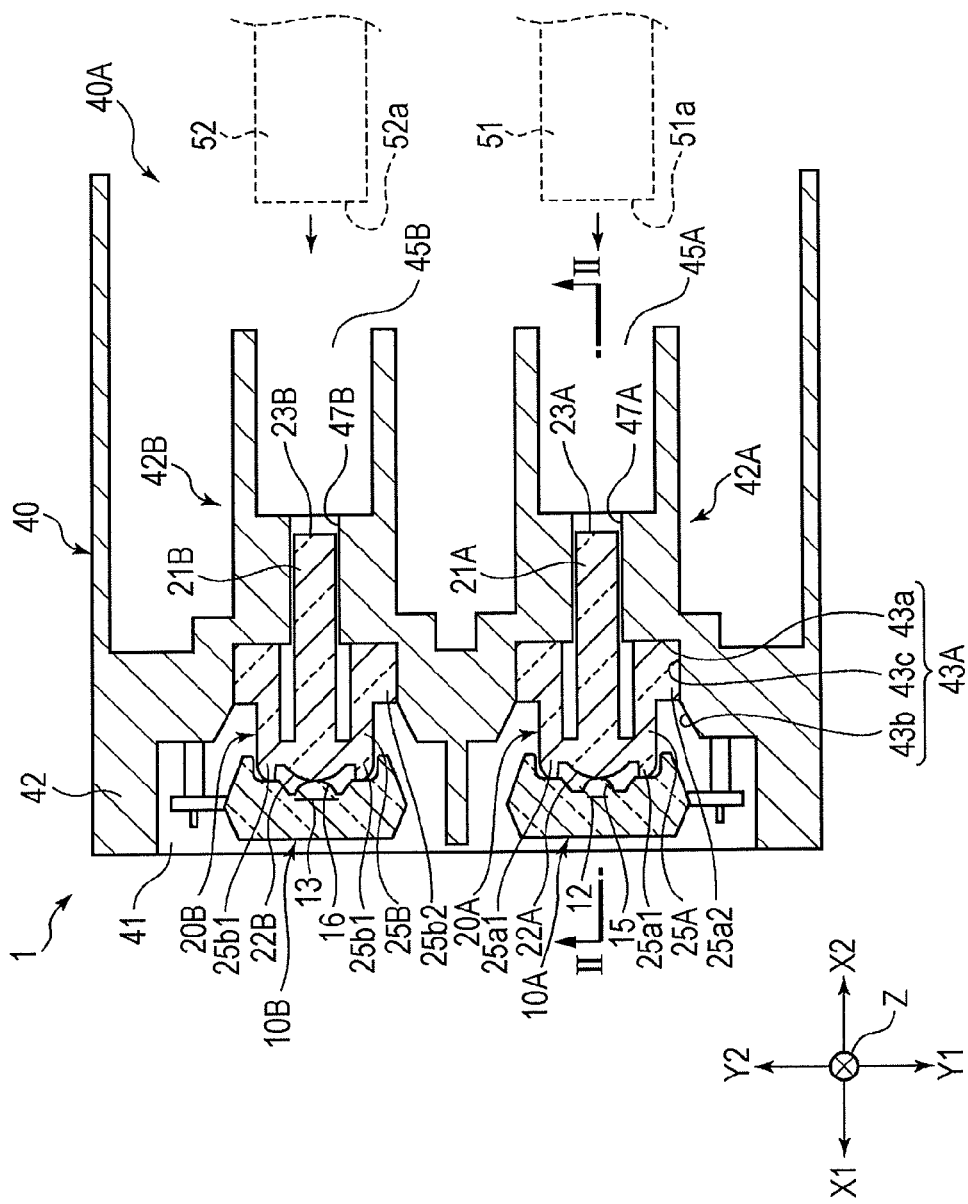
FIG. 1 is a sectional view of an optical connector according to an embodiment of the present invention.
Figure 2:
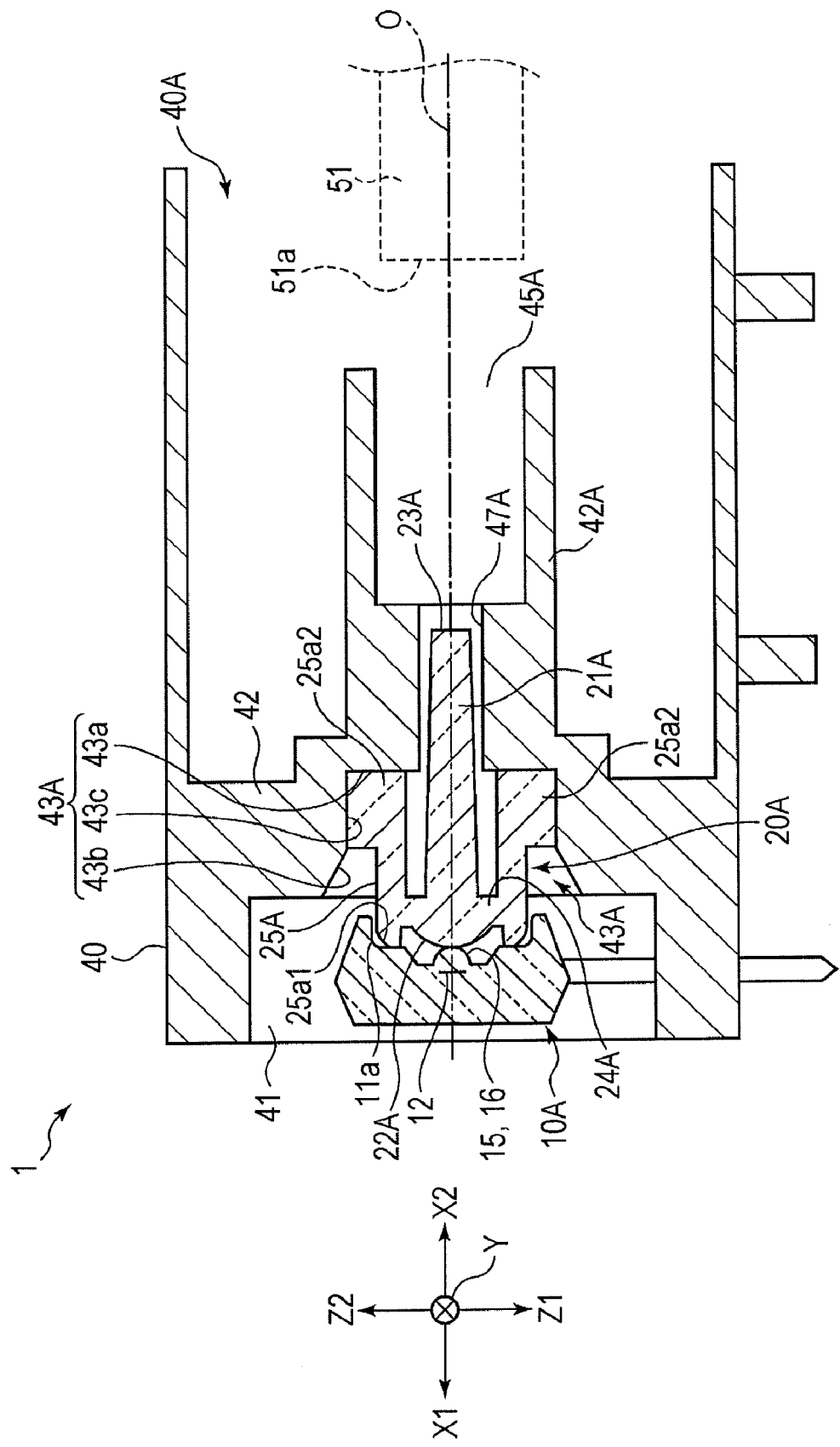
FIG. 2 is a sectional view of the optical connector taken along line II-II of FIG. 1.
Figure 3B:
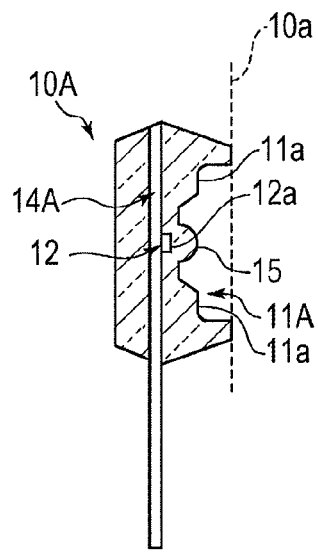
FIG. 3B is a sectional view of the transmitting optical module taken along line IIIB-IIIB of FIG. 3A.
Figure 3A:
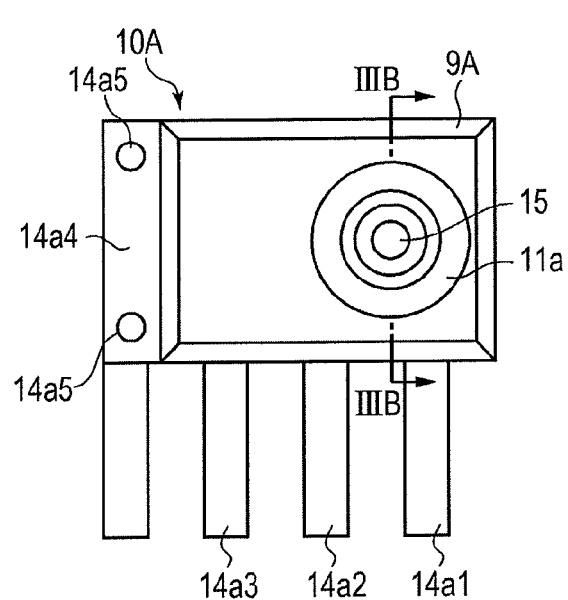
FIG. 3A is a front view of a transmitting optical module used in the optical connector.
Figure 4B:
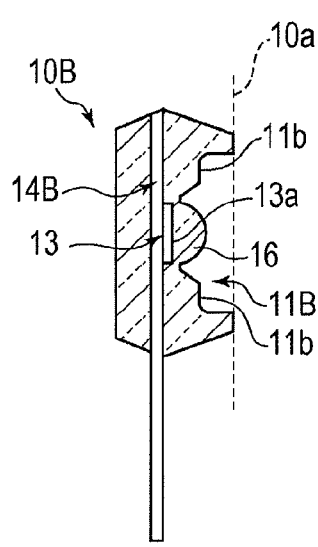
FIG. 4B is a sectional view of the receiving optical module taken along line IVB-IVB of FIG. 4A.
Figure 4A:
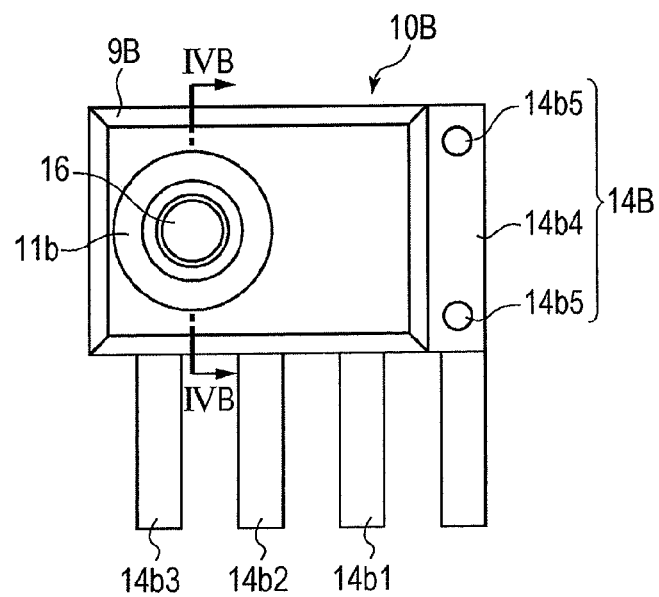
FIG. 4A is a front view of a receiving optical module used in the optical connector.

FIG. 1 is a sectional view of an optical connector according to an embodiment of the present invention; FIG. 2 is a sectional view of the optical connector taken along line II-II of FIG. 1; FIG. 3A is a front view of a transmitting optical module used in the optical connector, and FIG. 3B is a sectional view of the transmitting optical module taken along line IIIB-IIIB of FIG. 3A; and FIG. 4A is a front view of a receiving optical module used in the optical connector, and FIG. 4B is a sectional view of the receiving optical module taken along line IVB-IVB of FIG. 4A. FIG. 2 illustrates a state in which the transmitting optical module (see FIG. 3) is mounted in the housing.

The optical connector according to the present invention is used, for example, in an automobile that employs a media oriented systems transport (MOST), which is a vehicle data communication network. MOST is a network that is based on a ring topology using plastic optical fibers (POF).

As illustrated in FIG. 1, an optical connector 1, which is used for MOST, includes a transmitting optical module 10A, a receiving optical module 10B, a transmitting sleeve 20A, and a receiving sleeve 20B. These components are housed in a housing 40.

As illustrated in FIGS. 1 and 2, the optical connector 1, which is used for MOST, includes the housing 40 that is made of a synthetic resin.

A wall 42 separates a housing space 41 from an open end 40A. Sockets 42A and 42B are integrally formed at one end of the wall 42 so as to extend in the longitudinal direction (X direction) of the housing 40. Holding recesses 43A an 43B are integrally formed at the other end of the wall 42. Through-holes 47A and 47B are formed in the sockets 42A and 42B so as to extend in the longitudinal direction (X direction) of the housing.

The holding recesses 43A and 43B serve to position and fix the sleeves 20A and 20B. The through-holes 47A and 47B are holes into which light guides 21A and 21B of the sleeves 20A and 20B are inserted. To be specific, the holding recess 43A positions and fixes the transmitting sleeve 20A, and the holding recess 43B positions and fixes the receiving sleeve 20B. The through-hole 47A is a hole into which the light guide 21A of the transmitting sleeve 20A is inserted, and the through-hole 47B is a hole into which the light guide 21B of the receiving sleeve 20B is inserted.

Insertion recesses 45A and 45B are formed in the housing 40. Ferrules (not shown), which surround optical fibers 51 and 52, are inserted into the insertion recesses 45A and 45B.

The sleeves 20A and 20B are integrally formed of a polyolefin synthetic resin material that has a high transparency or a high light transmittance. It is preferable that the outer surface of each of the sleeves 20A and 20B excluding both end faces be covered by a cladding layer that has an index of refraction lower than that of the synthetic resin material. When the sleeves 20A and 20B are used in a state in which the outer surfaces of the sleeves 20A and 20B are in contact with air, whose index of refraction is lower than that of the synthetic resin material, the sleeves 20A and 20B need not be covered by cladding layers made of a different material. In this case, air functions as a cladding layer (air cladding).

In the present invention, the transmitting sleeve 20A and the receiving sleeve 20B have the same structure. Therefore, the transmitting sleeve 20A will be mainly described below. Portions of the transmitting sleeve 20A will be denoted by attaching A or (a) to numbers in twenties. Portions of the receiving sleeve 20B will be denoted by attaching B or (b) to numbers in twenties.

As illustrated in FIG. 2, the transmitting sleeve 20A includes the light guide 21A, which extends in the longitudinal direction (X direction) of the housing. The light guide 21A has a substantially conical-frustum-shape, and the diameter of the light guide 21A decreases in the X2 direction and increases in the X1 direction in FIG. 2. A second convex lens 22A is integrally formed with the light guide 21A on one end of the light guide 21A in the X1 direction in FIG. 2, at which the light guide 21A has a larger diameter. An end face 23A of the light guide 21A at the other end of the light guide 21A in the X2 direction in FIG. 2, at which the light guide 21A has a smaller diameter, is a surface that is perpendicular to the central axis O. An end face 51a of the optical fiber 51, which is illustrated with a dotted line, faces the end face 23A.

As illustrated in FIGS. 1 and 2, a flange 24A is formed around the light guide 21A near the transmitting optical module 10A (in the X1 direction). The flange 24A protrudes in a direction perpendicular to the central axis O (Y direction) and sideways in a direction perpendicular to the paper surface (Z direction). A substantially annular guide portion 25A is integrally formed at the edge of the flange 24A. The flange 24A and the substantially annular guide portion 25A are coaxial around the central axis O. A positioning protrusion 25a1 is formed at one end of the substantially annular guide portion 25A in the X1 direction. A positioning rib 25a2 is integrally formed at the other end of the substantially annular guide portion 25A. The positioning rib 25a2 has an outer diameter that is larger than that of the substantially annular guide portion 25A. The entirety of each of the sleeves 20A and 20B is formed with high precision by using an injection molding method.

Next, the optical modules will be described. As illustrated in FIGS. 1 to 4B, there are two optical modules. One is the transmitting optical module 10A, and the other is the receiving optical module 10B.

The transmitting and receiving optical modules 10A and 10B include base members 9A and 9B, which are made by molding a resin.

As illustrated in FIGS. 3A and 3B, the transmitting optical module 10A includes a light emitting element 12, such as an LED, which is disposed at the center of a recess 11A. A light emitting lens 15 (first convex lens) having a convex shape is formed so as to cover the light emitting element 12. As will be described below, light is emitted from a light emission surface 12a of the light emitting element 12, the light is collected by the light emitting lens 15 (first convex lens) having a convex shape, and thereby the light is efficiently transmitted to the sleeve 20A.

Likewise, as illustrated in FIGS. 4A and 4B, the receiving optical module 10B includes a light receiving element 13, such as a photodiode, which is disposed at the center of a recess 11B. A light receiving lens 16 (first convex lens) having a convex shape is formed so as to cover the light receiving element 13. Light exits the receiving sleeve 20B, the light is collected by the light receiving lens 16 (first convex lens) having a convex shape, and thereby the light is efficiently transmitted to a light receiving surface 13a of the light receiving element 13.

As illustrated in FIG. 3B, steps are formed on the transmitting optical module 10A. The steps extend from a front end surface 10a of the transmitting optical module 10A toward the light emitting element 12 disposed at the center of the recess 11A. A positioning recess 11a having an annular shape is formed by the steps. The positioning recess 11a comes in contact with the positioning protrusion 25a1 of the transmitting sleeve 20A when the transmitting sleeve 20A and the transmitting optical module 10A come in contact with each other. The positioning recess 11a, which is annular, surrounds the light emitting lens 15 (first convex lens).

Likewise, as illustrated in FIG. 4B, steps are formed on the receiving optical module 10B. The steps extend from the front end surface 10a of the receiving optical module 10B toward the light receiving element 13 at the center of the recess 11B. A positioning recess 11b having an annular shape is formed by the steps. The positioning recess 11b comes in contact with a positioning protrusion 25b1 of the receiving sleeve 20B when the receiving sleeve 20B and the receiving optical module 10B come in contact with each other. The positioning recess 11b, which is annular, surround the light receiving lens 16 (first convex lens).

The light receiving lens 16 is a convex lens having a diameter larger than that of the light emitting lens 15. By using the light receiving lens 16 having a larger diameter, the receiving optical module 10B can collect a larger amount of light and making the light enter the light receiving element 13. As a result, the light transmission efficiency can be increased.

The light emitting lens 15 is a convex lens having a smaller diameter than that of the second convex lens 22A, which is formed on the end face of the transmitting sleeve 20A that faces the light emitting lens 15. In other words, the diameter of the second convex lens 22A is larger than that of the light emitting lens 15. By using the light emitting lens 15 and second convex lens 22A of the transmitting sleeve, the transmitting optical module 10A can collect a larger amount of light that is emitted by the light emitting element 12. As a result, the light transmission efficiency can be increased.

As illustrated in FIGS. 3A and 3B, a part of a leadframe 14A, which is made of a conductor, is embedded in the base member 9A of the transmitting optical module 10A. Another part of the leadframe 14A is branched into lead terminals 14a1, 14a2, and 14a3. These lead terminals extend parallel to each other from the lower end of the base member 9A to the outside of the transmitting optical module 10A.

In the transmitting optical module 10A, the light emitting element 12 emits light when a predetermined electric current is fed, for example, between the lead terminal 14a1 and the lead terminal 14a2.

A fixing portion 14a4 and two through-holes 14a5 are formed in the left edge portion of the transmitting optical module 10A. The fixing portion 14a4 is integrally formed with the leadframe 14A. The through-holes 14a5 serve as a positioning guide when mounting the transmitting optical module 10A in the housing 40, so that the transmitting optical module 10A can be easily positioned in the housing space 41 in the housing 40.

As illustrated in FIGS. 4A and 4B, a part of a leadframe 14B, which is made of a conductor, is embedded in the base member 9B of the receiving optical module 10B. Another part of the leadframe 14B is branched into lead terminals 14b1, 14b2, and 14b3. These lead terminals extend parallel to each other from the lower end of the base member 9B to the outside of the receiving optical module 10B.

In the receiving optical module 10B, when the light receiving element 13 receives light, an electric current flows between, for example, the lead terminal 14b2 and the lead terminal 14b3.

A fixing portion 14b4 and two through-holes 14b5 are formed in the right edge portion of the receiving optical module 10B. The fixing portion 14a4 is integrally formed with the leadframe 14B. The through-holes 14b5 serve as a positioning guide when mounting the receiving optical module 10B in the housing 40, so that the receiving optical module 10B can be easily positioned in the housing space 41 in the housing 40.

Next, how the optical connector 1 is assembled will be described.

In the present invention, the transmitting optical module 10A and the receiving optical module 10B have the same structure, and the transmitting sleeve 20A and the receiving sleeve 20B have the same structure. Therefore, the transmitting optical module 10A and the transmitting sleeve 20A will be mainly described below.

As illustrated in FIGS. 1 and 2, the transmitting sleeve 20A is mounted in the housing 40. The transmitting sleeve 20A is mounted into the housing 40 from the X1 side of FIGS. 1 and 2. At this time, the transmitting sleeve 20A is mounted in the housing space 41 so that the end face 23A on a side opposite to the light guide 21A (X2 side) faces in the X2 direction. The end face 23A of the transmitting sleeve 20A is inserted into the through-hole 47A through the holding recess 43A. At this time, the positioning rib 25a2, which is integrally formed with the substantially annular guide portion 25A, is inserted into the holding recess 43A while being guided by a tapered surface 43b of the holding recess 43A. When the positioning rib 25a2 contacts a bottom surface 43a of the holding recess 43A, the insertion of the transmitting sleeve 20A is finished. At this time, the outer circular surface of the positioning rib 25a2 contacts an inner surface 43c of the holding recess 43A, whereby the transmitting sleeve 20A is precisely positioned in directions perpendicular to the central axis O of the transmitting sleeve 20A (Y and Z directions).

As illustrated in FIG. 2, the positioning rib 25a2 contacts the bottom surface 43a and the inner surface 43c of the holding recess 43A, whereby the transmitting sleeve 20A is precisely positioned in the X direction that is parallel to the central axis O of the transmitting sleeve 20A. Thus, the end face 23A of the light guide 21A (X2 side) can be located at a predetermined position in the housing 40. As a result, the distance between the end face 23A and the end face 51a of the optical fiber 51 that is plugged into the open end 40A can be set as designed. Therefore, the light transmission efficiency between the end face 23A of the light guide 21A and the end face 51a of the optical fiber 51 can set at a predetermined level.

Next, the transmitting optical module 10A is mounted in the housing space 41 in the housing 40. As illustrated in FIGS. 3A and 3B, in the left edge portion of the transmitting optical module 10A, the fixing portion 14a4 is integrally formed with the leadframe 14A. Moreover, the through-holes 14a5 and 14a5, which serve as a positioning guide when the transmitting optical module 10A is mounted into the housing 40, are formed in the left edge portion. Two protrusions (not shown), which are formed on the housing 40, are inserted into the through-holes 14a5 and 14a5, whereby the transmitting optical module 10A is positioned.

As illustrated in FIGS. 1 and 2, the transmitting optical module 10A is mounted into the optical connector 1 so that the front side thereof, on which the light emitting lens 15 (first convex lens) is disposed, faces in the X2 direction.

At this time, the positioning protrusion 25a1 of the transmitting sleeve is inserted into the recess 11A, which is formed in the outer periphery of the light emitting lens 15 (first convex lens), and the positioning protrusion 25a1 contacts the surface of the positioning recess 11a.

Thus, the light emitting lens 15 (first convex lens) of the transmitting optical module 10A and the second convex lens 22A, which is on the X1 side of the transmitting sleeve 20A, can be arranged on the central axis O with high precision. The light emitting lens 15 is a convex lens having a diameter smaller than that of the second convex lens 22A, which is formed on the end face of the transmitting sleeve 20A that faces the transmitting optical module 10A. In other words, the diameter of the second convex lens 22A is larger than that of the light emitting lens 15. Therefore, even if the light emitting lens 15 and the second convex lens 22A are displaced from the central axis O to a certain extent, a larger amount of light that is emitted by the light emitting element 12 can be collected by using the light emitting lens 15 and the second convex lens 22A of the transmitting sleeve.

Moreover, the distances among the light emitting element 12, the light emitting lens 15, and the second convex lens can be set at predetermined values.

Likewise, when mounting the receiving optical module 10B into the housing 40, the positioning protrusion 25b1 of the receiving sleeve 20B is inserted into the recess 11B formed in the outer periphery of the receiving lens 16 (first convex lens), and the positioning protrusion 25b1 contacts the surface of the positioning recess 11b.

Then, the receiving optical module 10B is fixed in the housing space 41 in the state in which the positioning protrusion 25b1 of the receiving sleeve 20B is in contact with the surface of the positioning recess 11b.

The transmitting and receiving optical modules 10A and 10B are fixed because the fixing portions 14a4 and 14b4 are fixed by using a holding member and an attachment hole (not shown), which are disposed in the housing space 41, and because the lead terminals are soldered to the connection holes (not shown) formed in a substrate.

As can be seen from FIGS. 1 and 2, with the present invention, in which the first convex lenses 15 and 16 of the transmitting and receiving optical modules are disposed so as to face the second convex lenses 22A and 22B of the transmitting and receiving sleeves, the optical coupling loss is smaller than that of the structure described in Japanese Unexamined Patent Application Publication No. 2002-23025, in which the end face of the transmitting sleeve that faces the transmitting optical module is a flat surface. That is, the light transmission efficiency can be increased.

Because the convex lenses are disposed so as to face each other, a substantial coupling loss that may cause a problem does not occur even when the distance between the first convex lens and the second convex lens is as large as 0.5 mm. This distance is sufficiently large so that the first and second convex lenses are not affected by a mechanical load (which may cause friction between the first and second convex lenses and deform the lenses, and thereby may cause a coupling loss).

It is preferable that a cover (not shown) that covers the housing space 41 be attached to an end of the housing 40 on the X1 side and the inner surface of the cover support or press the back surfaces (on the X1 side) of the transmitting and receiving optical modules 10A and 10B. In this case, the distance between the sleeves 20A and 20B and the optical modules 10A and 10B can be controlled with high precision.

Thus, with the present invention, the optical modules 10A and 10B and the optical fibers 51 and 52 can be attached to both ends of the sleeves 20A and 20B in the longitudinal direction with high precision, whereby the light transmission efficiency of the optical connector in its entirety is increased.

As described above, the transmitting sleeve and the receiving sleeve have the same shape. Therefore, when using the optical connector 1 for transmission, the sleeve can be used for transmission, and when using the optical connector 1 for receiving, the sleeve can be used for receiving. Because the same sleeve can be used both for transmission and for receiving, the cost of manufacturing the optical connector 1 can be reduced.

Next, a method of manufacturing the optical module will be described. In the present invention, the transmitting optical module 10A and the receiving optical module 10B have the same structure except for the optical elements. Therefore, the transmitting optical module 10A will be mainly described below.

First, the light emitting element 12 is mounted on the leadframe 14A. That is, the leadframe 14A having a plurality of lead terminals 14a to 14c is prepared, and the light emitting element 12 is fixed to a predetermined position on the leadframe 14A. In the case of the receiving optical module 10B, the light receiving element 13 is mounted.

Electrodes (the anode and the cathode) of the optical element (the light emitting element 12 or the light receiving element 13) are electrically connected to the lead terminals 14a1 and 14a3 or to the lead terminals 14a2 and 14a3 of the leadframe 14A by, for example, wire bonding.

In the case of the light emitting element 12, the light emitting lens 15 (first convex lens) is placed on the light emission surface 12a. In the case of the light receiving element 13, the light receiving lens 16 (first convex lens) is placed on the light receiving surface 13a.

Next, the periphery of the leadframe 14A is transfer molded with a resin to form the base member 9A.

That is, the leadframe 14A is placed in a predetermined dye, a resin (for example, epoxy resin) that has been melted, is poured into the cavity of the dye through a small hole, and the resin is cured in the cavity.

After the resin has been cured, the leadframe 14A is taken out of the dye to obtain the transmitting optical module 10A, which has a predetermined shape and in which the periphery of the leadframe 14A is molded with the base member 9A. The light emitting lens 15 is exposed on the front surface of the transmitting optical module 10A.

Thus, a transmitting optical module having precise dimensions can be easily manufactured with a simple process.

The first convex lens 15 (light emitting lens) may be made in the dye at the same time as making the base member 9A by molding the leadframe 14A. In this case, a transparent synthetic resin is used for molding.

With this method, it is not necessary to use a glass lens. Moreover, because the base member 9A and the first convex lens are made from the same material in the same process, the manufacturing process can be simplified.

In the case of the transmitting optical module 10A, the light emitting element 12 can be disposed at an appropriate position of the transmitting optical module 10A with high precision. Moreover, the first convex lens can be positioned relative to the light emitting element 12 with high precision. Likewise, in the case of the receiving optical module 10B, the light receiving element 13 can be disposed at an appropriate position of the receiving optical module 10B with high precision. Moreover, the first convex lens can be positioned relative to the light receiving element 13 with high precision.

What is claimed is:

1. An optical connector comprising:
   an optical module including:
     an optical element that emits light;
     a first convex lens that covers the optical element that emits light; and
     a positioning recess that surrounds the first convex lens; and
   a sleeve that optically interconnects the optical module and an optical fiber, wherein the sleeve being an integrally formed member including:
     a light guide;
     a second convex lens formed on an end face of the sleeve, wherein the end face faces the optical module and the second convex lens faces the first convex lens of the optical element;
     a substantially annular guide portion; and
     a positioning protrusion formed on an end face of the substantially annular guide portion, wherein:
       the positioning protrusion faces the optical module and contacts the positioning recess of the optical module so that the sleeve is positioned relative to the optical module; and
       a diameter of the second convex lens of the sleeve is larger than a diameter of the first convex lens of the optical element that emits light; and
   a housing that houses the optical module and the sleeve.

2. The optical connector according to claim 1, wherein a positioning rib is integrally formed with the substantially annular guide portion of the sleeve, and the positioning rib contacts the housing so that the sleeve is mounted in the housing at a predetermined position.

3. The optical connector according to claim 1, comprises a light receiving optical module which includes a light receiving optical element, and a light receiving convex lens which covers the light receiving optical element, wherein a diameter of the light receiving convex lens is larger than the diameter of the first convex lens.

* * * * *